United States Patent
Achatz

Patent Number: 6,130,540
Date of Patent: Oct. 10, 2000

[54] MEASUREMENT SYSTEM FOR ELECTRIC DISTURBANCES IN A HIGH-VOLTAGE SWITCHBOARD PLANT

[75] Inventor: Norbert Achatz, Berlin, Germany

[73] Assignee: Siemens AG, Munich, Germany

[21] Appl. No.: 09/011,671

[22] PCT Filed: Aug. 5, 1996

[86] PCT No.: PCT/DE96/01482

§ 371 Date: Apr. 21, 1998

§ 102(e) Date: Apr. 21, 1998

[87] PCT Pub. No.: WO97/07411

PCT Pub. Date: Feb. 27, 1997

[30] Foreign Application Priority Data

Aug. 15, 1995 [DE] Germany ............ 195 31 827

[51] Int. Cl.[7] ................................ G01R 31/06
[52] U.S. Cl. .............. 324/536; 324/552; 324/520; 324/521
[58] Field of Search ................ 324/535, 521, 324/536, 520, 424, 552; 340/644, 646, 647

[56] References Cited

U.S. PATENT DOCUMENTS

| 4,241,373 | 12/1980 | Mara et al. |
|---|---|---|
| 4,277,746 | 7/1981 | Abe et al. |
| 5,200,737 | 4/1993 | Konishi ................... 324/535 |
| 5,223,795 | 6/1993 | Blades . |
| 5,396,180 | 3/1995 | Hampton et al. |

FOREIGN PATENT DOCUMENTS

| 0 402 906 | 12/1990 | European Pat. Off. |
|---|---|---|
| 0 488 719 | 6/1992 | European Pat. Off. |
| 43 10 619 | 10/1993 | Germany . |
| 691 00 721 | 6/1994 | Germany . |
| WO 92/06385 | 4/1992 | WIPO . |

OTHER PUBLICATIONS

"Techniques and Instrumentation for Measurement of Transients in Gas–Insulated Switchgear," Boggs et al., IEEE Transactions on Electrical Insulation, vol., EI–19, No. 2, Apr., 1984, pp. 87–92.

"Operation and Diagnosis Assisting System for Solutions," Fujikawa et al., Hitachi Review, vol. 40, No. 5, 1991, pp. 359–366.

"Sensors for Measuring Rapid, Transient, Electromagnetic Fields in External Space of Gas–Insulated Switching Stations," Andreas Welsch, etz Archiv [Archive], vol. 10, No. 12, 1988, pp. 389–396.

"Capative Sensors for Measuring Transient Electrical Fields and Voltages," A. Küchler et al., Archiv für Elektrotechnik [Archive for Electrical Engineering], vol. 68, 1985, pp. 335–344.

Primary Examiner—Safet Metjahic
Assistant Examiner—Jose M. Solis
Attorney, Agent, or Firm—Kenyon & Kenyon

[57] ABSTRACT

In a measurement system for electric disturbances in a metalen-capsulated high-voltage switchgear having at least one measurement probe for each phase for decoupling of electromagnetic interference signals, both the interference signals and the useful voltage are scanned by the same measurement probe in each phase, and both are made accessible, separately from one another, at a filter arrangement.

6 Claims, 1 Drawing Sheet

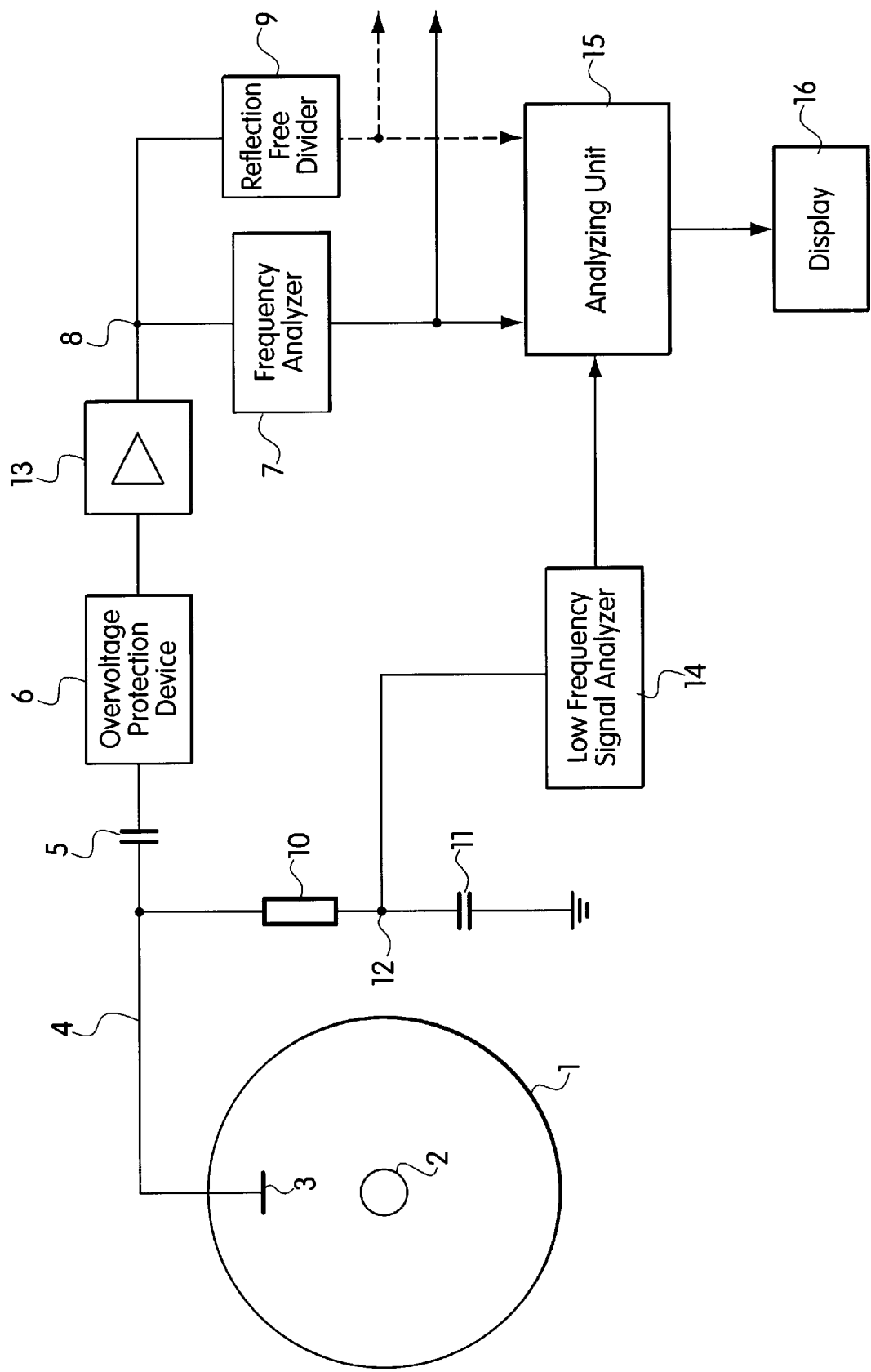

MEASUREMENT SYSTEM FOR ELECTRIC DISTURBANCES IN A HIGH-VOLTAGE SWITCHBOARD PLANT

FIELD OF THE INVENTION

The present invention relates to a measurement system for electric disturbances in an encapsulated high-voltage.

BACKGROUND INFORMATION

A brochure entitled "Diagnostic Monitoring Systems," University of Strathclyde, Scottish Power, and European Patent Application No. 488,719 describe a conventional measurement system which taps and analyzes interference signals using measurement probes.

To determine the relative phase angle of interference signals with respect to the useful voltage, the useful voltage is tapped in the phase in which an interference signal has occurred, and a signal proportional to the useful voltage is sent to the measurement system.

In investigating disturbances in the various phases, the appropriate phase must be selected for determination of the useful voltage signal to ascertain the phase angle of the interference signal.

Errors can easily occur in the correlation of phases with the interference signals, so that the wrong phase angle is assigned to an interference signal.

According to German Patent application No. 43 10 619, an interference signal in the high-frequency range is picked up using resonant circuits and conventional partial discharge measurement units, but this is not related to a useful signal (e.g., 50 Hz power supply voltage). Only high-frequency signals in different frequency ranges are detected.

U.S. Pat. No. 5,223,795 describes a method where a loss of high-frequency signal components relative to a fundamental frequency is detected. To monitor the high-frequency signal components of the voltage, the phase conductor is connected electrically or by way of a current transformer to a high-frequency analyzing unit as well as a device for analyzing the fundamental frequency.

German Patent No. 69,100,721 describes an arrangement for detecting conducted interference signals in conjunction with electric machines. Detection takes place exclusively through capacitive coupling of the measurement device to the system.

U.S. Pat. No. 5,396,180 describes a detection system for signals in a high-voltage switchgear where signals in the UHF range are obtained by operating a measurement electrode as an antenna, but information about the variation over time of the line frequency (see U.S. Pat. No. 5,396,180, FIG. 5, upper right) is evidently obtained from a separate device.

SUMMARY OF THE INVENTION

The present invention relates to a measurement system for measuring electric disturbances in an encapsulated high-voltage switchgear which carries a useful voltage in the form of a low-frequency a.c. voltage. The measurement system includes at least one measurement probe for each phase for tapping electromagnetic interference signals from the switchgear. The system further includes an analyzing unit to determine the time of the occurrence of interference signals with respect to the period of the useful low-frequency voltage of the respective phase at which the interference signals occur. Both the interference voltage and the useful voltage are picked off in at least one phase by the same measurement probe. The measurement probe is designed as a measurement electrode without an electrical connection. An object of the present invention is to make available in the simplest possible way a signal that corresponds to the useful voltage and which can be correlated with an interference signal in a certain phase.

This object is achieved according to the present invention because the interference signals and the useful voltage are accessible separately from one another at a filter arrangement which simultaneously triggers both antenna mode in the high-frequency range between approximately 300 MHZ and 3 GHz through a first protective circuit, and at the same time capacitive voltage divider mode in the low-frequency range through a second protective circuit.

The design according to the present invention ensures that the correct phase with the proper useful voltage signal will be reliably assigned to an interference signal that occurs, and therefore the relative phase angle can also be determined reliably.

If different measurement probes are to be scanned in succession, through the present invention the signals detected by a measurement probe are automatically correctly assigned to the useful voltage signal of the appropriate phase.

Furthermore, the present invention eliminates the need for a separate device for separate pickup of the useful signal from the high-voltage switchgear or separate measurement probes for tapping the useful voltage signal.

The present invention is based on the fact that one and the same measurement probe makes it possible to supply information about both high-frequency interference signals and the useful low-frequency a.c. voltage without any electrical connection to a high-voltage conductor.

For the high-frequency signal components, the measurement electrode forms an antenna for receiving electromagnetic radiation, as is described in U.S. Pat. No. 5,223,795. For the present frequency range (approx. 300 MHz to 3 GHz), coupling to the interior of the enclosure of the high-voltage switchgear is not merely capacitive.

Information about the variation over time of the useful voltage is achieved through purely capacitive coupling of the measurement electrode to a high-voltage conductor, as is customary in high-voltage measurement technology, despite the low-resistance coupling for high-frequency interference signals. This is accomplished by the resulting voltage division of the high voltage to the high-voltage capacitor formed between the high-voltage conductor and the measurement electrode, and the low-voltage capacitor connected between to the measurement electrode and the ground potential over a coil.

For the required sensitivity of the high-frequency measurement signals (interference signals) received in antenna mode, a 50 Ω measurement and amplifier technique that is conventional and advantageous in HF technology can be used.

These two different types of signals thus drop at different load impedances, i.e., at a low resistance, preferably 50 Ω, for "antenna mode," and at a high resistance, preferably $\geq 1$ MΩ, for "voltage divider mode."

The property of such a measurement probe of detecting two different types of information in different frequency ranges by means of different function principles permits a simple, inexpensive and reliable design of the measurement system.

Furthermore, it may be advantageous to provide additional filter arrangements to make it possible to pick off interference signals in several different frequency ranges.

With the present design it is possible to analyze interference signals in different frequency ranges. This is especially advantageous because different disturbances occurring in different insulation materials in switchgear will propagate interference signals in different frequency ranges, so that the distribution of the frequency components of interference signals permits an inference regarding the type of disturbance occurring.

An advantageous exemplary embodiment of the invention provides a capacitor connected to a measurement probe by means of a measurement line, so that high-frequency interference signals can be picked up at the present capacitor; the measurement line between the measurement probe and the capacitor is connected to ground potential via a low-pass filter; and both the capacitor and the output of the low-pass filter are connected to an analyzing unit for analyzing the relative phase angle of interference signals to the useful voltage.

The capacitor together with the low-pass filter forms a filter arrangement, with the high-frequency signal components being picked off at the capacitor, and the low-frequency signal components being picked off at the low-pass filter. The path for the high-frequency signal components is advantageously designed for frequencies, for example, up to 3 GHz.

The low-pass filter can be implemented by using a coil, for example, which is connected in series with another capacitor.

The capacitive and inductive elements used in the filter arrangement are advantageously tuned to one another in such a way as to achieve the minimal possible phase shift of the useful voltage signal.

It may be especially advantageous for a filter arrangement to be connected downstream from the capacitor to permit interference signals to be picked up in several different frequency ranges.

This exemplary embodiment makes it possible to analyze high-frequency interference signals in various frequency ranges.

Another advantageous exemplary embodiment of the present invention provides for higher-frequency parasitic signals of transient overvoltages to be picked off with a damped intensity at the low-pass filter in addition to the useful voltage signal.

The presence of high-frequency signal components of transient overvoltages in addition to the useful voltage signal indicates that a switching operation of an isolating switch or a circuit-breaker has just taken place in the high-voltage switchgear. Both transient overvoltages and interference signals regularly occur in such switching operations.

If, when an interference signal occurs, it is found that signal components of transient overvoltages are also occurring in addition to the useful signal, then the interference signals need not necessarily be interpreted as indicating that there is a disturbance. Accordingly, an interference signal measurement that has been performed can be repeated at a later time, for example.

It may also be advantageous for the analyzing unit to have a testing device for testing the signal applied at the output of the low-pass filter for high-frequency signal components of the useful voltage or the resulting overvoltages, and testing device having the effect that no disturbance is reported in the case when higher-frequency signal components of the useful voltage are present.

BRIEF DESCRIPTION OF THE DRAWING

FIG. 1 shows an encapsulating tube with a measurement system for a single phase according to the present invention.

DETAILED DESCRIPTION OF THE INVENTION

A high-voltage conductor 2 runs concentrically in encapsulating tube 1. These two components also form a coaxial line on which high-frequency interference can propagate. High-voltage conductor 2 carries an a.c. voltage with a line frequency of 50 Hz, for example, as the useful voltage.

A measurement probe 3, e.g., in the form of a metallic measurement electrode insulated from encapsulating tube 1, is arranged in encapsulating tube 1 and is connected to an insulated measurement line 4 which passes through enclosure casing 1, connecting measurement probe 3 to an electronic measurement system. The measurement electrode is thus capacitively connected to the high-voltage conductor. A first capacitor 5 is connected to measurement line 4 and forms a first high-pass filter, relaying high-frequency signals to an overvoltage protection device 6.

Overvoltage protection device 6 ensures that sensitive downstream electronic measurement systems are adequately protected.

The high-frequency signals are relayed from overvoltage protection device 6 via an amplifier 13 to a frequency analyzer 7 where a precision analysis of the high-frequency signals, for example, by Fourier transform, and optionally a comparison with reference patterns are performed. At terminal 8, to which the frequency analyzer 7 is connected, the unweighted interference signal can also be picked off and processed further over a reflection-free divider 9 or terminated at 50 Ω.

In addition to capacitor 5, an inductance 10 is also connected to measurement line 4, e.g., in the form of a coil which, together with a downstream capacitor 11 and the capacitance of measurement electrode 3 to high-voltage conductor 2, forms a capacitive voltage divider. A load impedance of a few megaohms may be provided at terminal 12 between inductance 10 and capacitor 11. The low-frequency signal components, in particular those of line frequency, can be picked off at terminal 12.

A device 14 for analyzing low-frequency signal components is connected at terminal 12. The device 14 analyzes the line-frequency components of the signals sampled by measurement probe 3 and optionally analyzes signal components of transient overvoltages that have been switched through due to their high intensity.

Capacitors 5, 11 and inductance 10, including the stray capacitance and the load impedance at terminal 12, must be tuned to one another so that no interfering phase shift occurs between the useful voltage on conductor 2 and the useful voltage signal picked off at terminal 12.

The result of signal analysis of the high-frequency components is delivered by elements 7 and 9 to an analyzing unit 15 which also receives from device 14 the result of analysis of the low-frequency signal components.

Analyzing unit 15 determines the relative phase angle of the high-frequency interference signal components in relation to the line-frequency signal components and makes the value of the relative phase angle available for further analysis and/or display 16.

Analyzing unit 15 also records the presence of interference signals of transient overvoltages, for example, and it optionally then delivers a signal indicating that there is a high probability that the high-frequency signals occurring have been induced by a switching operation in the switchgear.

A processing device may be integrated into frequency analyzer 7 to subdivide the frequency range of the signals occurring in the present branch of the filter arrangement into multiple subranges, each of which can be analyzed separately. The result of the present frequency analysis can be sent to analyzing unit 15 as well as to a weighting unit (not shown) to process the result further also taking into account the analysis result of analyzing unit 15.

In the present way, one or more high-frequency signal components as well as the respective line-frequency signal component can be picked off with a single measurement probe 3 for one phase of an encapsulated high-voltage switchgear.

What is claimed is:

1. A system for measuring an electric interference in an encapsulated high-voltage switchgear, the switchgear carrying a useful low-frequency alternating current voltage on a conductor, comprising:

at least one measurement probe receiving the interference signals and the useful voltage from the switchgear for each phase of at least one phase, the at least one measurement probe including a measurement electrode without an electrical connection to the conductor, both the interference signals and the useful voltage being picked off in at least one phase by a same one of the at least one measurement probe;

an analyzing device for determining an occurrence time of the received interference signals as a function of a period of the received useful voltage of a respective phase of the at least one phase in which the received interference signals occur; and a filter arrangement including a first circuit and a second circuit, the received interference signals and the received useful voltage being separately available at the filter arrangement, the filter arrangement concurrently effecting an antenna operation for electromagnetic radiation within a high-frequency range via the first circuit, and a capacitive voltage divider operation within a low-frequency range via the second circuit, the high-frequency range being approximately 300 MHz to 3 GHz.

2. The system according to claim 1 further comprising:

a capacitor coupled to the at least one measurement probe by a measurement line, the measurement line being connected to a ground potential across a low-pass filter, and the interference signals being available at the capacitor, and wherein the capacitor and an output of the low-pass filter are coupled to the analyzing device for analyzing a relative phase angle of the interference signals to the useful voltage.

3. The system according to claim 2, wherein the filter arrangement is coupled downstream from the capacitor to pick off the interference signals in a plurality of frequency ranges.

4. The system according to claim 1, wherein higher-frequency signal components of transient overvoltages with a damped intensity are available at the low-pass filter.

5. The system according to claim 4, wherein the analyzing device includes a testing device for testing a signal applied at the output of the low-pass filter for the higher-frequency signal components of one of the useful voltage and resulting overvoltages, and the testing device precludes reporting of disturbance when one of the higher-frequency signal components of the useful voltage and the resulting overvoltages are generated.

6. The system according to claim 1, wherein the first circuit forms a first branch of the filter arrangement, and the second circuit forms a second branch of the filter arrangement, the first branch being coupled to the measuring probe independently of the second branch.

* * * * *